United States Patent
Tsai et al.

(10) Patent No.: US 8,753,980 B2
(45) Date of Patent: *Jun. 17, 2014

(54) RAPID THERMAL ANNEALING TO REDUCE PATTERN EFFECT

(71) Applicants: Chun Hsiung Tsai, Xinpu Township (TW); Chii-Ming Wu, Taipei (TW); Da-Wen Lin, Hsinchu (TW)

(72) Inventors: Chun Hsiung Tsai, Xinpu Township (TW); Chii-Ming Wu, Taipei (TW); Da-Wen Lin, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/753,928

(22) Filed: Jan. 30, 2013

(65) Prior Publication Data

US 2013/0143418 A1    Jun. 6, 2013

Related U.S. Application Data

(63) Continuation of application No. 12/898,037, filed on Oct. 5, 2010, now Pat. No. 8,383,513.

(51) Int. Cl.
H01L 21/44    (2006.01)

(52) U.S. Cl.
USPC .... 438/663; 438/199; 438/633; 257/E21.077; 257/E21.084; 257/E21.333

(58) Field of Classification Search
USPC ........... 438/199, 633; 257/E21.077, E21.084, 257/E21.333
See application file for complete search history.

(56) References Cited

U.S. PATENT DOCUMENTS

| | | | |
|---|---|---|---|
| 6,174,783 B1 * | 1/2001 | Wakao | 118/715 |
| 8,383,513 B2 * | 2/2013 | Tsai et al. | 438/663 |
| 2003/0132435 A1 | 7/2003 | Nakazawa et al. | |
| 2003/0183612 A1 | 10/2003 | Timans et al. | |
| 2005/0116229 A1 | 6/2005 | Yoshimoto | |
| 2010/0099268 A1 | 4/2010 | Timans | |
| 2011/0177665 A1 | 7/2011 | Yang et al. | |

* cited by examiner

Primary Examiner — Michelle Mandala
(74) Attorney, Agent, or Firm — Lowe Hauptman & Ham, LLP

(57) ABSTRACT

A method of performing rapid thermal annealing on a substrate including heating the substrate to a first temperature in a rapid thermal annealing system having a front-side heating source and a backside heating source. The method further includes raising the temperature of the substrate from the first temperature to a second temperature greater than the first temperature. The backside heating source provides a greater amount of heat than the front-side heating source during the raising of the temperature of the substrate.

20 Claims, 7 Drawing Sheets

RAPID THERMAL ANNEALING TO REDUCE PATTERN EFFECT

RELATED APPLICATIONS

This application is a continuation of U.S. application Ser. No. 12/898,037, filed on Oct. 5, 2010, which is incorporated herein by reference in its entirety.

FIELD

This application relates to rapid thermal processing and, more particularly, to rapid thermal annealing after ion implantation.

BACKGROUND

Semiconductor integrated circuit microelectronic fabrications are formed from semiconductor substrates within and upon which are formed semiconductor devices, and over which are formed patterned conductor layers separated by dielectric layers. Ubiquitous within the fabrication of semiconductor integrated circuit microelectronic fabrications is the use of field effect transistor (FET) devices as switching devices within both logic semiconductor integrated circuit microelectronic fabrications and memory semiconductor integrated circuit microelectronic fabrications. Field effect transistor (FET) devices are ubiquitous within the art of semiconductor integrated circuit microelectronic fabrication for use as switching devices within logic and memory semiconductor integrated circuit microelectronic fabrications. Field effect transistor (FET) devices, in addition to being generally readily fabricated within semiconductor integrated circuit microelectronic fabrications, are also generally readily scalable within semiconductor integrated circuit microelectronic fabrications.

While field effect transistor (FET) devices are thus clearly desirable and essential in the art of semiconductor integrated circuit microelectronic fabrication, the fabrication of field effect transistor (FET) devices with enhanced performance is challenging to achieve while simultaneously decreasing the dimensions. It is within this context the following disclosure arises.

BRIEF DESCRIPTION OF THE DRAWINGS

The present disclosure will be readily understood by the following detailed description in conjunction with the accompanying drawings, and like reference numerals designate like structural elements.

DETAILED DESCRIPTION OF THE EXEMPLARY EMBODIMENTS

Figure 1:
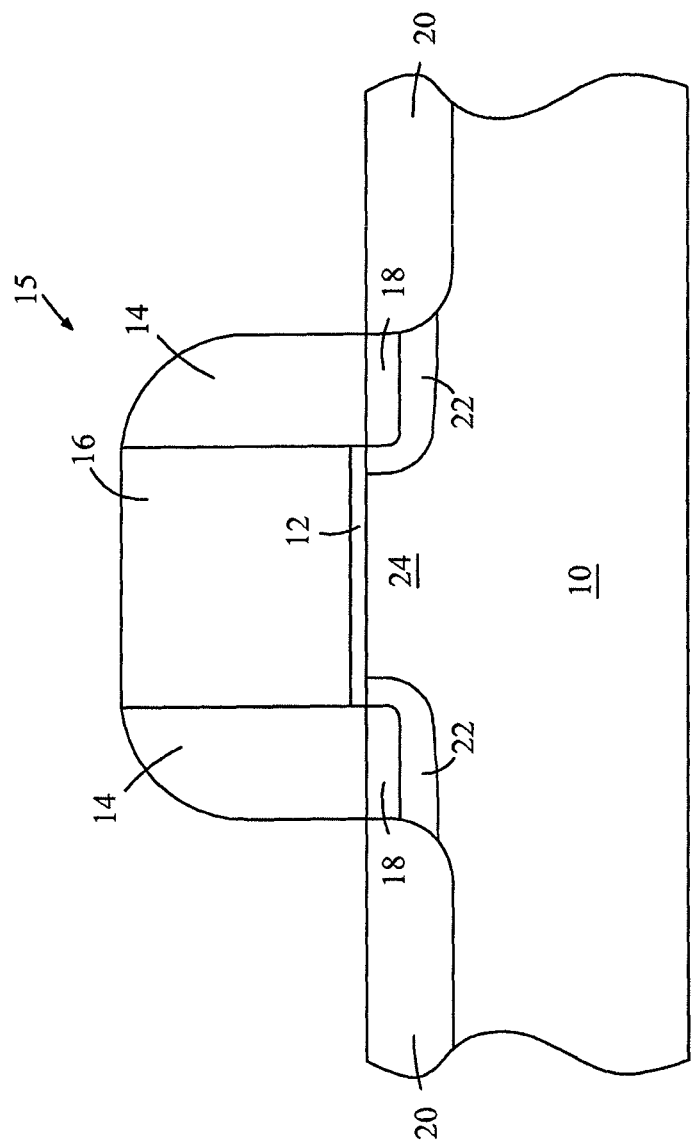
FIG. 1 illustrates a NMOS (n-type metal-oxide-semiconductor) transistor, in accordance with some embodiments.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a NMOS (n-type metal-oxide-semiconductor) transistor, in accordance with some embodiments. The NMOS transistor is formed in a substrate 10, such as p-doped silicon substrate. The NMOS transistor includes a gate structure 15 with a gate oxide layer 12 formed over the substrate, a polysilicon gate 16, and side spacers 14. In some embodiments, the gate 16 is a metal gate. For some advanced generations, a dummy polysilicon gate is formed, and then removed. A metal gate is formed in the opening left by the removal of the dummy polysilicon gate. Underlying the side spacers 14 are ultra-shallow lightly doped drain (LDD) regions 18, specifically n-type LDD regions. Deeper, more highly-doped source/drain (S/D) regions 20 are formed adjacent to the NLDD regions 18. P-type pockets 22 are formed underneath the NLDD regions 18 and adjacent to the S/D regions 20, extending into the channel region 24. In some embodiments, the pockets 22 are not formed. As will be understood by those familiar with transistor formation, the channel length depends on the technology node/generations. In various embodiments, the technology node/generation is 90 nm or less (e.g., 90 nm, 75 nm, 65 nm, 53 nm, 45 nm, 37 nm, 32 nm, 22 nm, 18 nm, 14 nm, 10 nm, etc.). The example shown in FIG. 1 is an NMOS transistor. Similar structures and dopant regions can also be drawn for PMOS transistors.

In the creation of ultra-shallow p-n junctions in CMOS manufacturing, special attention is given to forming MOS S/D regions. In the creation of the implant regions, such as regions 18, and regions 20, n-type dopants are implanted into the surface layer(s) of the exposed substrate surface. In the creation of the pockets implant regions 22, p-type dopants are implanted. Examples of n-type dopants may include, but are not limited to, phosphorous (P), arsenic (As), and antimony (Sb). Examples of p-type dopants may include, but are not limited to, boron (B) and indium (In). The implanted dopants are driven deeper into the substrate by thermal annealing. Thermal anneal (or annealing) not only drives the dopants deeper into the substrate, it can also recover defects caused by implantation and activate dopants.

The thermal annealing can be performed by a furnace anneal process, a rapid thermal anneal process, a flash anneal process, or other applicable processes. For advanced process technologies, the thermal anneal for LDD, S/D, and in some embodiments pockets is often done with rapid thermal anneal (spike anneal), or a combination of rapid thermal anneal and flash anneal.

Figure 2A:
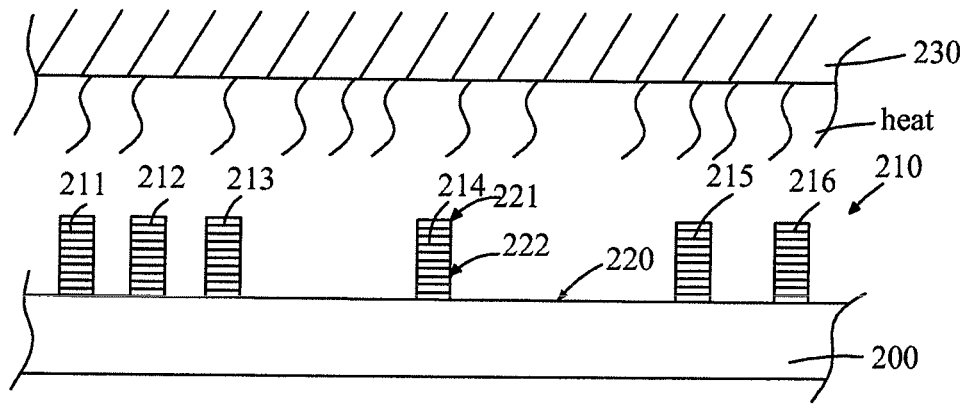
FIGS. 2A-2C show schematic diagrams of a device region 210 of a substrate 200 in different rapid thermal processing chambers, in accordance with some embodiments.

Rapid thermal anneal process is performed in a rapid thermal processing chamber, which has a number of heating elements (such as lamps) that can be powered up to heat up the wafer (or substrate) rapidly. For advanced technology nodes, high within-die (WID) and within-wafer (WIW) thermal uniformities are important to ensure devices across the substrate perform according to design. FIG. 2A shows a schematic diagram of a device region 210 of a substrate 200 in a rapid thermal processing chamber (not shown), in accordance with some embodiments. In some embodiments, a heat source 230 on the front side of substrate 200 provides heat to increase the temperature of substrate 200. The heat source 230 is connected to a controller (not shown). The heat source 230 can produce a large amount of energy in a short period for rapid thermal annealing.

The device region 210 is on a portion of substrate 200 and includes a number of gate structures, 211-216, which are similar to gate structure 15 of FIG. 1. Gate structures 211, 212, and 213 are positioned close to one another, and can be described as dense pattern and having a high pattern density. In contrast, gate structure 214 stands alone, and can be described as an isolated pattern or having a very low pattern density. Gate structures 215 and 216 are positioned with a distance greater than the distances between structures 211, 212, and 213. The pattern density of gate structures 215 and 216 is higher than structure 214, but lower than structures 211, 212, and 213. Because the substrate 200, the gates of the gate structures, and the sidewalls (spacers) of the gate structures are made of different materials, the reflectivities of the exposed substrate surface 220, top surfaces 221 of gates structures, and sidewall surfaces 222 of gate structures are different. The varying patterns and pattern densities across the dies and substrate make the heat absorption non-uniform across the dies (or within a die, WID) hereinafter referred to as the pattern effect. The poor WID uniformity affects the uniformity of device performance within a die. Such non-uniformities could result in performance of some devices not meeting the specification.

Figure 2B:
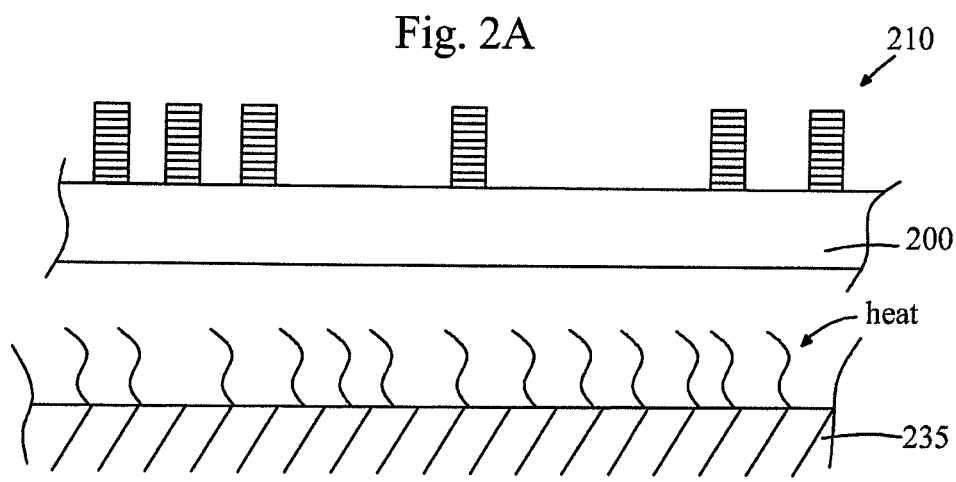

FIG. 2B shows the device region 210 in a different rapid thermal processing chamber (also not shown), in accordance with some embodiments. FIG. 2B shows that substrate 200 is heated from the backside. A backside heat source 235 generates heat to increase temperature of substrate (or wafer) 200. Because only the substrate backside is exposed to the heat source 235, the non-uniformity caused by variation of device patterns on substrate front side can be minimized or even eliminated. Because there is no front-side heat source, the front side of substrate 200 is heated by conduction of heat from substrate backside.

Figure 2C:
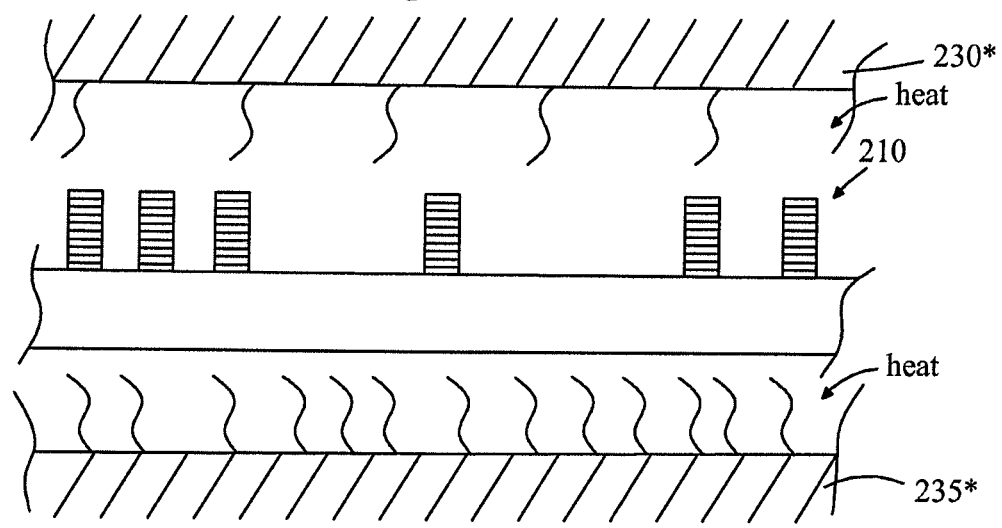

FIG. 2C shows the device region 210 in another different rapid thermal processing chamber (also not shown), in accordance with some embodiments. FIG. 2C shows that a front-side heat source 230* and a backside heat source 235* are used to heat up substrate 200. The front-side heat source 230* is used to warm up substrate 200 from the front side. As described above, due to non-uniformity reflectivity caused by varying pattern density, front-side heating should not contribute to the dopant drive-in (or diffusion), defect recovery (or recovery of implant defects), or dopant activation to avoid introducing non-uniformity in device performance. However, it can be used to bring the temperature of the front side of substrate 200 and chamber environment facing substrate 200 to a "warm" temperature, which is not at a temperature that would significantly contribute to dopant drive-in (or diffusion), defect recovery, or dopant activation. The functions of dopant drive-in (or diffusion), defect recovery, and dopant activation should be achieved by backside heating to avoid the pattern effect.

Figure 3A:
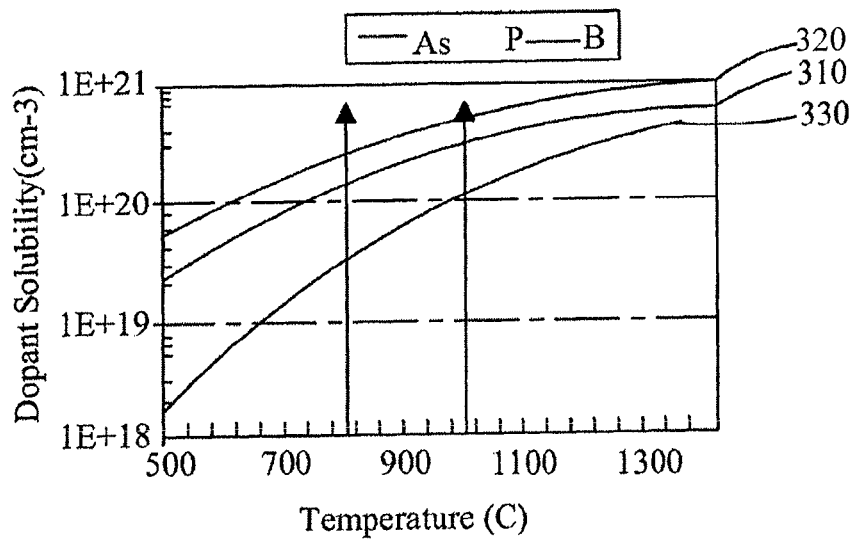
FIG. 3A shows a diagram of dopant solubility of As, P, and B in silicon as a function of temperature, in accordance with some embodiments.

FIG. 3A shows a diagram of dopant solubility of As (arsenic, curve 310), P (phosphorous, curve 320), and B (boron, curve 330) in silicon as a function of temperature, in accordance with some embodiments. Dopant activation is proportional to dopant solubility. The higher the dopant solubility is, the higher the amount of dopant activation can be achieved. The dopant solubilities of As, P, and B increase exponentially with temperature. The solubilities of As, P, and B are equal to or greater than about 1E20 $cm^{-3}$ when the temperature is equal to or greater than about 900° C. The solubilities of As and P are higher than B for a particular temperature. In order to achieve high amount of dopant activation, such as about 1E20 $cm^{-3}$ or higher, the annealing temperature needs to be relatively high, such as at 950° C. or higher for Boron.

Figure 3B:
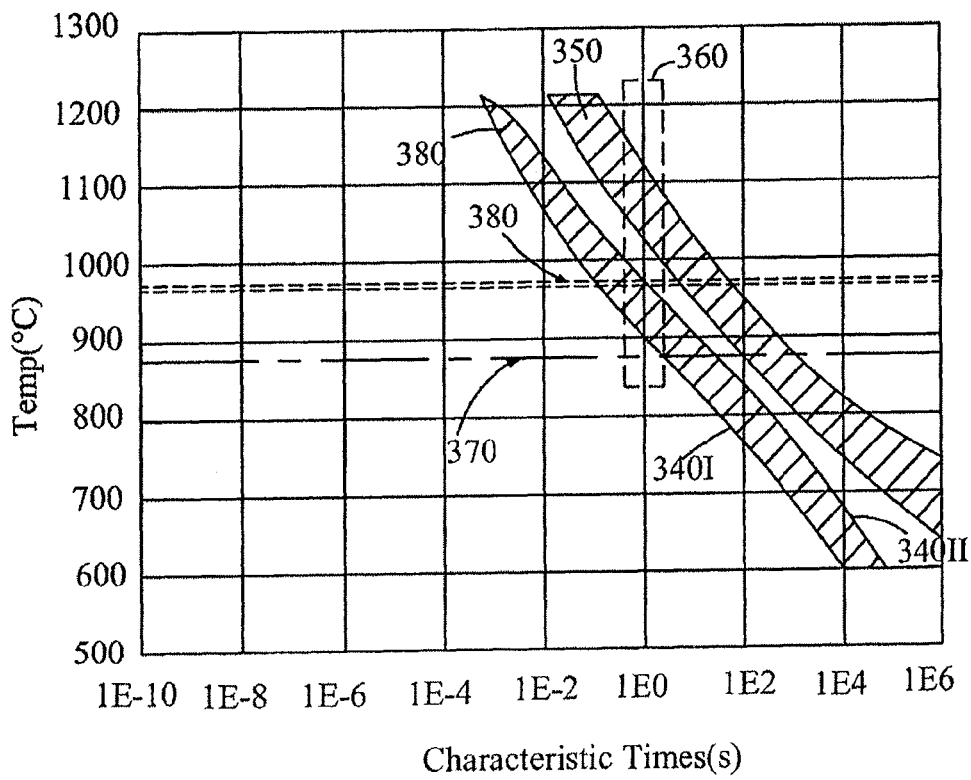
FIG. 3B shows a diagram of temperature and characteristic time for dopant diffusion and defect recovery of dopants, in accordance with some embodiments.

As mentioned above, annealing affects not only dopant activation, but also dopant diffusion (drive-in) and defect recovery. FIG. 3B shows a diagram of temperature and characteristic time for boron (B) and arsenic (As) diffusion (region 340) and defect recovery of dopants (region 350), in accordance with some embodiments. Boron diffusion is characterized by the lower portion of region 340 (along curve $340_I$) and arsenic diffusion is characterized by the higher portion of region 340 (along curve $340_{II}$). Boron is more diffusive than other types of dopants, such as As, P, etc. For spike anneal, the annealing characteristic time, measured by $T_{Peak-50C}$, is between about 0.5 second to about 2 seconds. $T_{Peak-50C}$ measures the time it takes to raise 50° C. near peak temperature. To achieve significant dopant diffusion, the temperature needs to be greater than about 850° C., according to FIG. 3B (see dotted region 360 and dotted line 370). The dotted line region 360 encloses the characteristic time between about 0.5 seconds to about 2 seconds, in accordance with some embodiments. Region 360 intersects region 340 (dopant diffusion) at a minimal temperature of about 850° C.

FIG. 3B also shows that dotted region 360 intersects region 350 (defect recovery) at a minimal temperature of about 950° C. This indicates that in order to achieve significant defect recovery, the temperature needs to be at least about 950° C. To avoid non-uniformities of dopant activation, dopant diffusion and defect recovery caused by varying pattern densities and varying reflectivity caused by the patterns on the front side of substrate 200, the front-side heat source 230* should not heat the front-side of substrate to a temperature close to more than 850° C. As described above, there is significant dopant diffusion at about 850° C. In some embodiments, the front-side heat source 230* is powered to heat up substrate 200 to a target temperature equal to or less than about 100° C. to about 200° C., such as 650° C., less than the dopant diffusion temperature (i.e. about 850° C.). The lower target temperature, between about 100° C. to about 200° C. less than the temperature with significant dopant diffusion (about 850° C.), provides a buffer against significant dopant diffusion. When the front-side heating source is used to heat the substrate front side to the target temperature (such as 650° C.), the front-side heating source causes insignificant (or almost no dopant diffusion. However, the substrate needs to be heated to about 950° C. or higher to achieve sufficient dopant activation, and defect recovery. Such high temperature heating can be accomplished by a backside heating source to reduce or eliminate the impact of the front-side pattern effect.

In some embodiments, small amounts of dopant diffusion, dopant activation, and/or dopant recovery by front-side heating source are permissible, as long as the backside heating is the dominant heating source. Because the backside heating does not introduce non-uniformity due to pattern density variation, its dominant heat effect evens out (or over-shadow) the non-uniformity introduced by front-side heating, if the font-side heating plays a minor role. In some embodiments, the front-side heating contributes to equal to or less than 30% of dopant activation and dopant diffusion. With the front-side contributing equal to less than about 30% the dominant backside heating (70%) evens out (or overshadow) the non-uniformity introduced by front-side heating. For example, the backside heating can be at higher power and raise the substrate temperature to a high degree, such as about 950° C. or higher. The majority of dopant diffusion, dopant activation and junction depth are achieved by backside heating. As a result, pattern affect on front-side heating is reduced and minimized and becomes a non-issue. At the same time, the rapid thermal annealing process can benefit from the heat contribution of the front-side heating source to raise the temperatures of environment facing the front side of the substrate and also the front side of the substrate. Because the front-side and backside heating sources provide uneven amounts of energy, the rapid thermal annealing of FIG. 2C is called asymmetric rapid thermal annealing.

Figure 4:
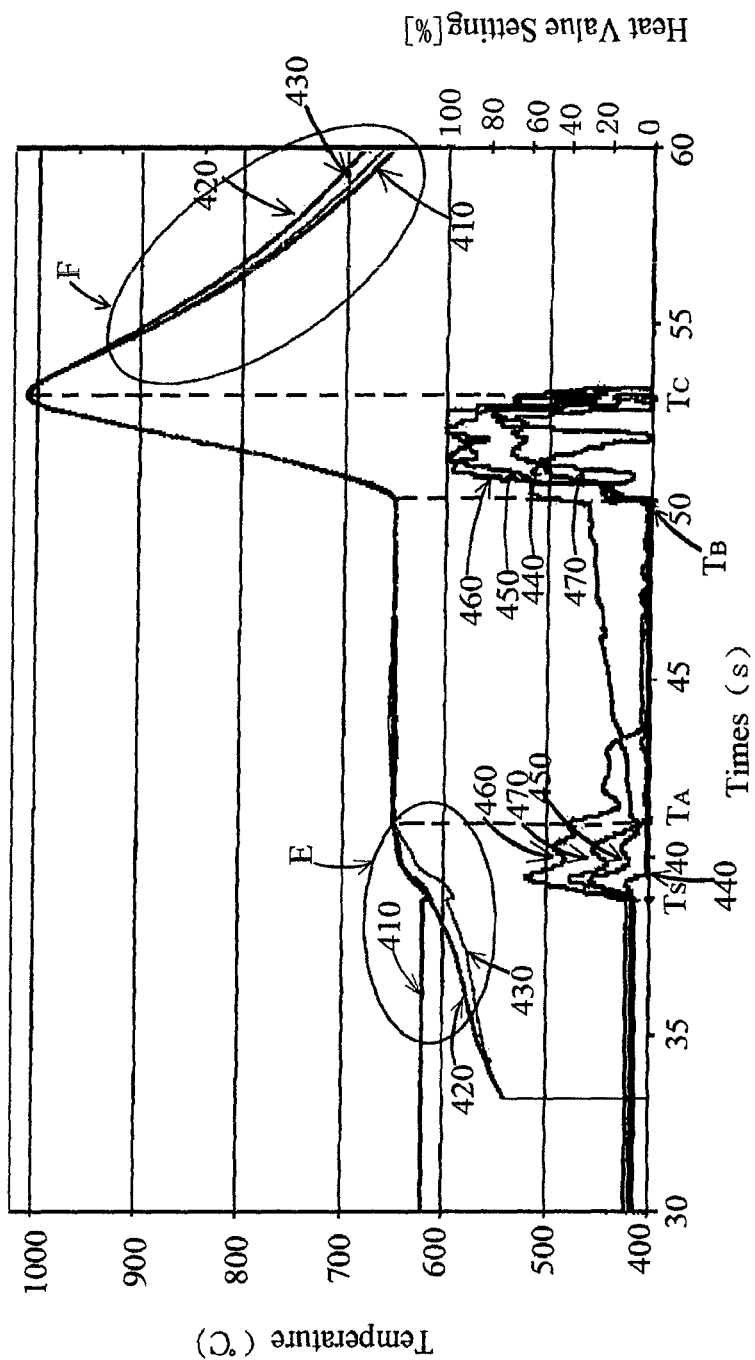
FIG. 4 shows a diagram of temperature as a function of time for an asymmetric rapid thermal annealing process, in accordance with some embodiments.

FIG. 4 shows a diagram of temperature as a function of time for an asymmetric rapid thermal annealing process, in accordance with some embodiments. In the diagram, the substrate is heated by a front-side heating source and a backside heating source. FIG. 4 shows a curve 410 of internal setpoint of temperature, which indicates the desired temperature curve set by the rapid thermal annealing (RTA) system. Curve 410 starts at about 620° C. and increase to 650° C. at $T_A$. Curve 410 maintains at 650° C. between $T_A$ and $T_B$ and increases to about 1010° C. at $T_C$. Curve 420 shows data measured by an optical pyrometer pointed near the center of the backside of the substrate. Curve 430 is measured by an optical pyrometer pointed near the edge of the backside of the substrate. The measurement data of curves 420 and 430 show that the rapid thermal processing equipment is able to bring up the temperature of the substrate to substantially track the temperature setpoint curve 410 between $T_A$ to $T_C$.

Figure 5A:
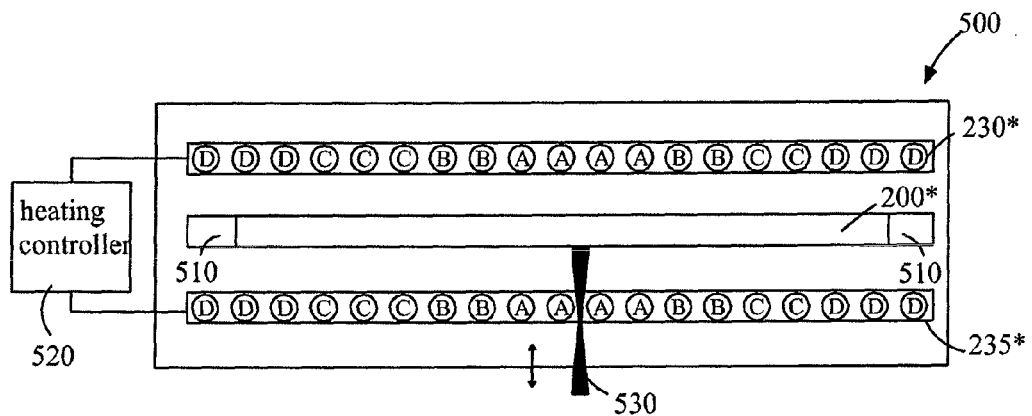
FIG. 5A shows a cross-sectional view of a rapid thermal processing equipment with a front-side and a backside heating sources to process a substrate, in accordance with some embodiments.
Figure 5B:
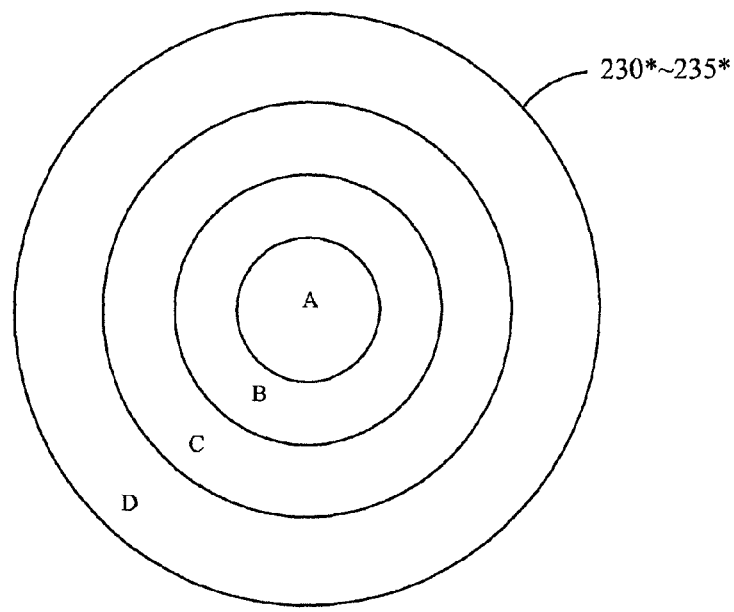
FIG. 5B shows a top view of four heating zones of FIG. 5A, in accordance with some embodiments.

FIG. 5A shows a cross-sectional view of a piece of rapid thermal processing equipment 500 with the front-side and backside heating sources (230* and 235*) used to process substrate 200*, in accordance with some embodiments. Substrate 200* is similar to substrate 200 in FIGS. 2A-2C, and is held in place by substrate holders 510, in some embodiments. Substrate 200* is raised or lowered by using a mechanical mechanism 530. Both the front-side and the backside heating sources (230* and 235*) have a number of heating elements, which are controlled by zones, such as zones A, B, C, D. The front-end and backside heating sources (230* and 236*) are controlled by a heating controller 520. FIG. 5B shows a top view of four heating zones of FIG. 5A, in accordance with some embodiments. Each zone is controlled to provide heating power separately from other zones. FIG. 5A shows that the heating elements and heating zones of the front-side heating source and the backside heating sources are similar. However, they do not need to be. Heating elements of the front-side heating source can be configured and controlled differently from the backside heating source. In addition, the zone division could also be different for the front-side heating source and the backside heating source. Further, the front-side heating source and backside heating source can be divided into 2, 3, 5, 6, or more zones, instead of 4 zones. In some embodiments, the front side heating sources are controlled separately from the backside heating sources.

Figure 5C:
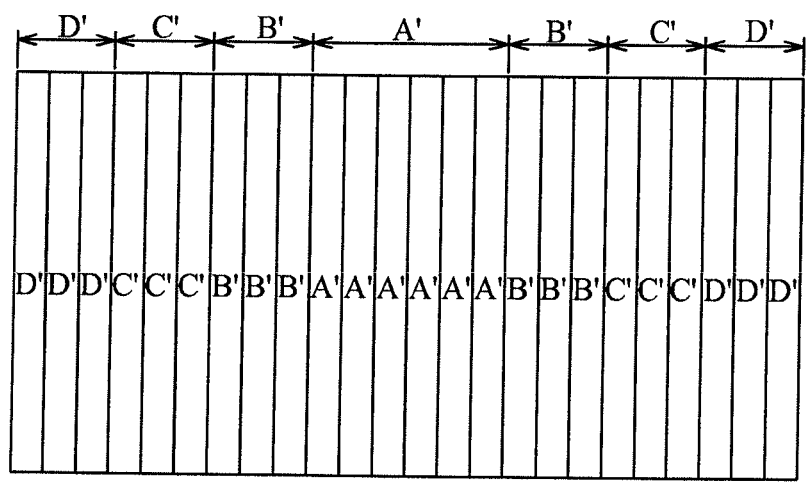
FIG. 5C shows a front-side or backside heating elements arranged in parallel, in accordance with some embodiments.

The heating elements and heating zones shown in FIGS. 5A and 5B are concentric. If the substrate is not circular, the heating elements and zones can be in different arrangements. For example, if the substrate is rectangular, the front-side and/or backside heating elements can be arranged in parallel, as shown in FIG. 5C in accordance with some embodiments. The heating elements in FIG. 5C could be a front-side heating source or backside heating source. The heating elements are controlled by zones, such as zones A', B', C', and D'.

The substrate 200* in FIG. 4 is initially heated with both the front-side and backside heat sources with at power levels at equal to or less than about 20% of the full powers of respective power sources. In some embodiments, the power of the front-side heating source is configured (or controlled) not to exceed 30% of the full power of the front-side power source. In some other embodiments, the power of the front-side heating source is configured (or controlled) not to exceed 20% of the full power of the front-side power source. However, backside heating source can use the full range of its power source. In some embodiments, the full power of the backside heating source is between about 50 KW (kilo watts) to about 250 KW. In some embodiments, the full power of the front-side heating source is also between about 30 KW to about 200 KW. In some other embodiments, the full power of the front-side heating source is between about 35 KW to about 175 KW and the front-side heating source can utilize its full power. In some embodiments, the front-side heat source contributes less than about 50% of total power used to raise the temperature of the substrate to the peak annealing temperature. In some other embodiments, the front-side heat source contributes to equal to or less than about 30% of total power used to raise the temperature of the substrate to the peak annealing temperature.

In the example in FIG. 4, power of the 4 zones, A, B, C, D of the heating sources (front and back) are shown in curves 440, 450, 460, and 470. During the entire thermal process, the front-side heating source is controlled to provide 1/6 (or 20/100 front/back ratio) of the total power and the backside heating source provides 5/6 of the total power in each zone. The power ratios are maintained throughout the process. The configuration of the front-side and back-side heating sources and the 4 zones will be described in FIGS. 5A and 5B later.

The total power is at about 10% of the peak power from the beginning until $T_S$. At $T_S$, different zones of the heating sources (front and back) are tuned to produce power differently to raise the substrate temperature to 650° C. and to improve temperature uniformity across the substrate. Curve 440 indicates the power level (percentage of full power) for zone A, and curve 450 indicates the power level for zone B. Curve 460 indicates the power level for zone C, and curve 470 indicates the power level (percentage of full power) for zone D. As shown in FIG. 4, the center pyrometer temperature (curve 420) in region F is higher than the edge temperature (curve 430). Therefore, power of zone A (curve 440) and zone 2B (curve 450) are tuned to be lower than zones C and D (curves 460 and 470 respectively) right after $T_S$ to increase the temperature at the edge region faster than the temperature in the center region. The scale of power percentage (or full power) is reflected on the right of FIG. 4.

The power tuning described here for the process used to generate data of FIG. 4 is merely an example. Other power tuning methods are also possible. In the example above, the front-side heating source is on during the time the substrate temperature is raised to the peak annealing temperature, i.e. between $T_A$ to $T_B$. In some embodiments, the front-side power is turned off right before the substrate temperature is to spike (or rapidly increase) from 650° C. to the peak temperature and only backside power is used to maintain and/or heat up the temperature of the substrate.

At $T_B$, the total power starts to be ramped up, with zone B power being increased and zones A, C, and D turning from off to on. The power ramping is rapid, as shown in FIG. 4. Curves 420 and 430 closely follow curve 410 (setpoint curve) (between $T_B$ and $T_C$). FIG. 4 shows that the substrate temperature is able to reach the targeted peak value of 1010° C. at $T_C$. During the ramping period (between $T_B$ and $T_C$), the powers at zones B and C are higher than the powers at zones A and D. However, this differentiation is merely an example; other power tuning methods and configuration of heating elements are also possible. After substrate 200* has reached the peak temperature, both the front-side and backside powers are then turned off, in accordance with some embodiments. The substrate is cooled by radiation and convention by using a cooling gas. The cooling gas is an inert gas, such as He, Ar, and $N_2$.

The thermal budget of a spike anneal processing system, which can be measured by $T_{Peak-50C}$, is desirable to be between about 0.5 second to about 2 seconds. The data in FIG. 4 show that the $T_{Peak-50C}$ is about 1.5 seconds, which is within the targeted region. This shows that asymmetric rapid thermal annealing system described above can meet the thermal budget target and is suitable for advanced device technologies.

As stated above, the tuning of various heating zones during the process can be different from what were described above to achieve good within wafer uniformity. In some embodiments, the maximum temperature difference measured across a wafer (WIW) is equal to or less than 5° C. In some other embodiments, the maximum temperature difference measured across a wafer is equal to or less than 2.5° C. In yet some other embodiments, the maximum temperature difference measured across a wafer is equal to or less than 1° C. With the annealing heat source mainly from the backside to reduce the pattern effect within a die (WID), the temperature uniformity within a die can be greatly improved. Since it is difficult to measure temperature variation within a die, speed delays of devices within a die can be measured to characterize temperature variation. With front-side only heating, the speed delay variation can be great than 15% across a die. However, with asymmetric heating described above, speed delay variation across a die can be reduced to less than about 5% or even better.

As mentioned above, data shown in FIG. 4 are merely examples. Other methods of tuning the front-side and backside powers to achieve good WIW and WID thermal uniformity can also be used. As described above, the backside heating source should play the dominant role in bringing the temperature of the substrate to the peak annealing temperature to reduce or eliminate the pattern effect. The front-side heating source could help heat up the front side of the processing chamber and the front side of the substrate to a degree that does not cause significant dopant diffusion. As mention above, the front-side heat source can be used to heat up the substrate to a temperature less than between about 100° C. to about 200° C. less than a temperature that dopant diffusion becomes observable or measurable (or significant). Using the example described above, dopant diffusion for the most diffusive dopant, boron, becomes significant at about 850° C. If the power level(s) front-side heat source (including all zones) is only able to heat the substrate up to between about 650° C. and about 750° C., the contribution of dopant diffusion by front-side heat source would be negligible.

Another way to minimize the contribution of front-side heating to limit the impact of reflectivity in WID non-uniformity is to limit the level of power provided by the front-side heating source. For example, if the power of the front-side heating is equal to or less a percentage, such as 30% or less, of the total power during the entire annealing process, the impact of non-uniformity caused by pattern effect can be minimized, since the backside power contribute to the majority of heating (e.g. 70% or greater). The dominant effect of backside heating (no pattern effect) will overshadow or override the contribution from front side heating (with pattern effect). Even if the front-side power contributes to about 50% of the total power, the resulting effect would still be better than the results from front-side only heating. In some embodiments, the power of the front-side heating is equal to or less than a percentage, such as 20% or less, of the total power during the entire annealing process. In some other embodiments, the power of the front-side heating is equal to or less than a percentage, such as 15% or less, of the total power during the entire annealing process.

Figure 6:
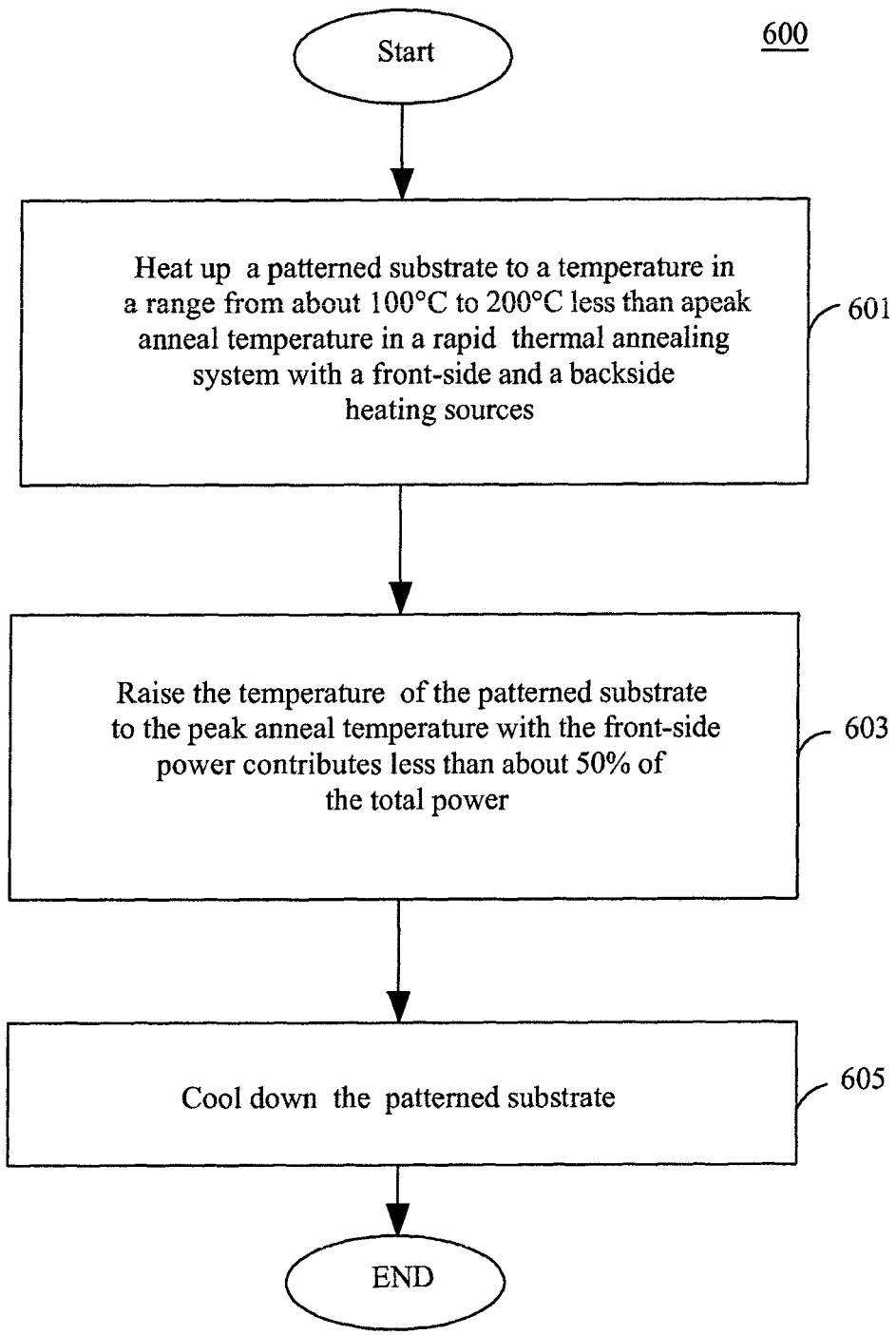
FIG. 6 shows a process flow of rapid thermal annealing substrate, in accordance with some embodiments.

FIG. 6 shows a process flow 600 of rapid thermal annealing of a substrate, in accordance with some embodiments. In some embodiments, the substrate is patterned. In some embodiments, the substrate has exposed gate structures on the front side of the substrate. In some other embodiments, the substrate has other types of structures (non-gate structures) exposed, such as interconnect structures, which can also benefit from asymmetric rapid thermal annealing in reducing pattern effect. The substrate is first placed in the rapid thermal annealing chamber, which has a front-side heating source and a backside heating source. In some embodiments, the heating elements of the front-side heating source and the backside heating source are divided into zones to be controlled by zones. At operation 601, the substrate is heated up to a temperature in a range from about 100° C. to about 200° C. less than a peak anneal temperature. The annealing apparatus has a front-side heating source and a backside heating source. In some embodiments, both the front-side and backside heating sources are divided into multiple zones. These zones are controlled separately. In some embodiments, each zone includes front-side heating elements of the front-side heating source and back-side heating elements of the backside heating source. In some other embodiments, the front-side heating source and the backside heating source are controlled separately.

At operation 603, the substrate is heated to a peak temperature. During operation 603, the front-side heating source is turned off in some embodiments. In some embodiments, the power of the front-side heating source is kept constant at the level of operation 601 and only the backside power is increased. In some other embodiments, the front-side heating source contributes equal to or less than about 50% of the total power and does not significantly contribute to raising the substrate temperature to the peak temperature to improve the uniformity of the WID substrate temperature. In some embodiment, the front-side heating source contributes to equal to or less than about 30% of total power. The front-side and backside sources are tuned to increase the WIW temperature uniformity. After the peak anneal temperature is reached, the substrate is cooled down in operation 605. The mechanism used for cooling down the substrate has been described above.

The embodiments of rapid thermal annealing methods and systems described above could be used to anneal patterned substrates with minimal pattern effect on substrate temperature non-uniformity. The rapid thermal annealing system includes a front-side heating source and a backside heating source. The backside heating source of the rapid thermal annealing system supplies the dominant amount of heat (or energy) to bring the substrate temperature to the peak annealing temperature. The front-side heating source contributes to heat up the environment near the front-side of the substrate to a temperature lower than about 100° C. to about 200° C. less than the peak annealing temperature. The asymmetric frontside and backside heating for rapid thermal annealing reduce or eliminate pattern effect and can improve WIW and WID device performance uniformity. The methods and systems can be used to perform any type of rapid thermal anneal, such as an LDD anneal, a S/D anneal and a pocket anneal.

One aspect of this description relates to a method of performing rapid thermal annealing on a substrate. The method includes heating the substrate to a first temperature in a rapid thermal annealing system having a front-side heating source and a backside heating source. The method further includes raising the temperature of the substrate from the first temperature to a second temperature greater than the first temperature. The backside heating source provides a greater amount of heat than the front-side heating source during the raising of the temperature of the substrate.

Another aspect of this description relates to a method of performing rapid thermal annealing on a substrate. The method includes heating the substrate from a first temperature to a second temperature. The step of heating the substrate to the second temperature includes providing a first amount of heat from a backside heating source and providing a second amount of heat from a front-side heating source. The first amount of heat is greater than the second amount of heat.

Still another aspect of this description relates to a rapid thermal annealing system. The rapid thermal annealing system includes a front-side heating source. The front-side heating source includes a first heating zone and a second heating zone closer to an outer edge of the rapid thermal annealing system than the first heating zone. The rapid thermal annealing system further includes a backside heating source. The backside heating source includes a third heating zone substantially aligned with the first heating zone and a fourth heating zone closer to the outer edge of the rapid thermal annealing system than the third heating zone, wherein the fourth heating zone is substantially aligned with the second heating zone. The rapid thermal annealing system further includes a heating controller configured to control a power of the front-side heating source and a power of the backside heating source, wherein the heating controller is configured to control the power of the backside heating source to be greater than the power of the front-side heating source.

Various modifications, changes, and variations apparent to those of skill in the art may be made in the arrangement, operation, and details of the methods and systems disclosed. Although the foregoing has described the embodiments in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of performing rapid thermal annealing on a substrate, the method comprising:
    heating the substrate to a first temperature in a rapid thermal annealing system having a front-side heating source and a backside heating source; and
    raising the temperature of the substrate from the first temperature to a second temperature greater than the first temperature, wherein the backside heating source provides a greater amount of heat than the front-side heating source during the raising of the temperature of the substrate.

2. The method of claim 1, wherein heating the substrate to the first temperature comprises:
    providing a first amount of heat from the front-side heating source; and
    providing a second amount of heat from the backside heating source, wherein a heating ratio of the first amount of heat to the second amount of heat is approximately 5/6.

3. The method of claim 2, wherein raising the temperature of the substrate comprises maintaining the heating ratio.

4. The method of claim 1, wherein heating the substrate to the first temperature comprises:
    providing a first amount of heat from a first front-side heating source;
    providing a second amount of heat from a second front-side heating source;
    providing a third amount of heat from a first backside heating source substantially aligned with the first front-side heating source across the substrate; and
    providing a fourth amount of heat from a second backside heating source substantially aligned with the second front-side heating source across the substrate, wherein a first heating ratio between the first amount of heat and the third amount of heat is substantially equal to a second heating ratio between the second amount of heat and the fourth amount of heat.

5. The method of claim 4, wherein raising the temperature of the substrate comprises maintaining the first heating ratio and the second heating ratio.

6. The method of claim 4, wherein providing the second amount of heat comprises providing heat from the second front-side heating source disposed concentric with the first front-side heating source.

7. The method of claim 4, wherein providing the second amount of heat comprises providing heat from the second front-side heating source disposed parallel to the first front-side heating source and closer to an edge of the rapid thermal annealing system than the first front-side heating source.

8. The method of claim 1, further comprising maintaining the substrate at the first temperature for a first time period, wherein raising the temperature of the substrate to the second temperature in a second time period, and the first time period is longer than the second time period.

9. The method of claim 1, further comprising cooling the substrate from the second temperature to a third temperature lower than the second temperature by flowing an inert gas over the substrate.

10. The method of claim 1, wherein heating the substrate to the first temperature comprises heating an edge portion of the substrate faster than a center portion of the substrate.

11. The method of claim 1, further comprising cooling the substrate from the second temperature to a third temperature lower than the second temperature, wherein cooling the substrate comprises at least one of radiative cooling or convective cooling.

12. The method of claim 1, wherein heating the substrate comprises heating the substrate from the first temperature to the second temperature in a time period ranging from about 0.5 seconds to about 2 seconds.

13. A method of performing rapid thermal annealing on a substrate, the method comprising:
    heating the substrate from a first temperature to a second temperature, wherein heating the substrate to the second temperature comprises:
        providing a first amount of heat from a backside heating source, and
        providing a second amount of heat from a front-side heating source, wherein the first amount of heat is greater than the second amount of heat.

14. The method of claim 13, wherein the first temperature is about 100° C. to about 200° C. below the second temperature.

15. The method of claim 13, further comprising heating the substrate to the first temperature using heat provided from at least one of the backside heating source or the front-side heating source.

16. The method of claim 13, wherein providing the first amount of heat from the backside heating source comprises:
providing a third amount of heat from a first backside heating source; and
providing a fourth amount of heat from a second backside heating source, wherein the third amount of heat is greater than the second amount of heat.

17. The method of claim 16, wherein providing the third amount of heat from the first backside heating source comprises providing the third amount of heat from the first backside heating source at a position closer to an edge of the substrate than providing the fourth amount of heat from the second backside heating source.

18. The method of claim 17, wherein providing the first amount of heat from the backside heating source further comprises providing a fifth amount of heat from a third backside heating source, the fifth amount of heat is greater than the third amount of heat, and providing the fifth amount of heat from the third backside heating source comprises providing the fifth amount of heat from the first backside heating source at a position closer to an edge of the substrate than providing the third amount of heat from the first backside heating source.

19. The method of claim 17, wherein providing the first amount of heat from the backside heating source further comprises providing a fifth amount of heat from a third backside heating source, the fifth amount of heat is less than the fourth amount of heat, and providing the fifth amount of heat from the third backside heating source comprises providing the fifth amount of heat from the first backside heating source at a position closer to an edge of the substrate than providing the fourth amount of heat from the second backside heating source.

20. A method of performing rapid thermal annealing on a substrate, the method comprising:
heating the substrate to a first temperature in a rapid thermal annealing system having a first heating source disposed on a first side of the substrate and a second heating source disposed on a second side of the substrate opposite the first side; and
raising the temperature of the substrate from the first temperature to a second temperature greater than the first temperature, wherein the second heating source provides a greater amount of heat than the first heating source during the raising of the temperature of the substrate.

* * * * *